(12) United States Patent
Mun

(10) Patent No.: US 11,705,475 B2
(45) Date of Patent: Jul. 18, 2023

(54) METHOD OF FORMING SHALLOW TRENCH ISOLATION (STI) STRUCTURE FOR SUPPRESSING DARK CURRENT

(71) Applicant: OmniVision Technologies, Inc., Santa Clara, CA (US)

(72) Inventor: Seong Yeol Mun, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 29 days.

(21) Appl. No.: 17/558,858

(22) Filed: Dec. 22, 2021

(65) Prior Publication Data

US 2022/0115434 A1 Apr. 14, 2022

Related U.S. Application Data

(62) Division of application No. 16/748,604, filed on Jan. 21, 2020, now Pat. No. 11,282,890.

(51) Int. Cl.
*H01L 27/146* (2006.01)

(52) U.S. Cl.
CPC .... *H01L 27/14687* (2013.01); *H01L 27/1463* (2013.01); *H01L 27/14603* (2013.01); *H01L 27/14632* (2013.01); *H01L 27/14689* (2013.01)

(58) Field of Classification Search
CPC ......... H01L 27/14687; H01L 27/14603; H01L 27/1463; H01L 27/14632; H01L 27/14689;

(Continued)

(56) References Cited

U.S. PATENT DOCUMENTS

| 6,114,741 A | 9/2000 | Joyner et al. |
| 7,429,496 B2 | 9/2008 | Yaung |

(Continued)

FOREIGN PATENT DOCUMENTS

| TW | 201830681 A | 8/2018 |
| TW | 201913991 A | 4/2019 |
| WO | WO 2004044989 A1 | 5/2004 |

OTHER PUBLICATIONS

Taiwanese Patent Application No. 109133368 Office Action dated May 25, 2021, with English translation, 22 pages.

(Continued)

*Primary Examiner* — Duy T Nguyen
(74) *Attorney, Agent, or Firm* — Cozen O'Connor

(57) ABSTRACT

A method of fabricating a target shallow trench isolation (STI) structure between devices in a wafer-level image sensor having a large number of pixels includes etching a trench, the trench having a greater depth and width than a target STI structure and epitaxially growing the substrate material in the trench for a length of time necessary to provide the target depth and width of the isolation structure. An STI structure formed in a semiconductor substrate includes a trench etched in the substrate having a depth and width greater than that of the STI structure, and semiconductor material epitaxially grown in the trench to provide a critical dimension and target depth of the STI structure. An image sensor includes a semiconductor substrate, a photodiode region, a pixel transistor region and an STI structure between the photodiode region and the pixel transistor region.

17 Claims, 8 Drawing Sheets

(58) Field of Classification Search
CPC ......... H01L 27/14643; H01L 27/14612; H01L 21/76224; H01L 21/02532; H01L 21/02634
USPC .......................................................... 438/151
See application file for complete search history.

(56) References Cited

U.S. PATENT DOCUMENTS

| | | |
|---|---|---|
| 7,723,206 B2 | 5/2010 | Miyachi et al. |
| 7,893,469 B2 | 2/2011 | Lee |
| 8,173,502 B2 | 5/2012 | Yan et al. |
| 8,415,189 B2 | 4/2013 | Kwon et al. |
| 10,170,517 B2 | 1/2019 | Lee et al. |
| 2002/0106864 A1 | 8/2002 | Chen et al. |
| 2004/0004264 A1* | 1/2004 | Son .................... H01L 29/1083 257/E29.054 |
| 2004/0089914 A1 | 5/2004 | Mouli et al. |
| 2004/0164373 A1* | 8/2004 | Koester ............... H01L 29/7842 438/296 |
| 2005/0253214 A1 | 11/2005 | Nagasaki et al. |
| 2006/0049437 A1 | 3/2006 | Hwang |
| 2006/0138470 A1 | 6/2006 | Han |
| 2011/0032405 A1* | 2/2011 | Nozaki ............. H01L 27/14603 257/E31.097 |
| 2014/0084418 A1 | 3/2014 | Ervin et al. |
| 2015/0214266 A1* | 7/2015 | Kao .................. H01L 27/14616 257/292 |
| 2017/0338327 A1 | 11/2017 | Liu et al. |
| 2018/0047569 A1* | 2/2018 | Huang ................ H01L 21/0262 |

OTHER PUBLICATIONS

Taiwanese Patent Application No. 109133369 Office Action dated Apr. 23, 2021, with English translation, 17 pages.
U.S. Appl. No. 16/748,657 Notice of Allowance dated Feb. 2, 2022. 10 pages.

* cited by examiner

METHOD OF FORMING SHALLOW TRENCH ISOLATION (STI) STRUCTURE FOR SUPPRESSING DARK CURRENT

CROSS-REFERENCE TO RELATED APPLICATIONS

This application is a divisional application of and claims priority to U.S. application Ser. No. 16/748,604 (now U.S. Pat. No. 11,282,890) filed Jan. 21, 2020, and titled "Shallow Trench Isolation (STI) Structure for Suppressing Dark Current and Method of Forming," the entirety of which is incorporated herein by reference.

BACKGROUND

Wafer-level manufacturing using complementary metal-oxide semiconductor (CMOS) technology has enabled the incorporation of camera modules in many applications including automotive, security and mobile devices. For example, FIG. 1 depicts a camera 190 imaging a scene. Camera 190 includes an image-sensor 100, which includes a pixel array 154. In an embodiment, pixel array 154 is an array of individual pixels formed in a semiconductor wafer substrate such as silicon. Similar cameras used in automotive applications include, for example, a back-up camera, as well as front and side cameras.

There is a continuous demand for greater resolution in image sensors, preferably achieved by increasing the number of pixels on a wafer while maintaining the overall image sensor at the same dimension or even smaller. The more pixels in the image sensor, the greater the resolution of an image captured by the image sensor. This can be accomplished both by reducing pixel size so that more pixels may be placed on the wafer or by reducing the space between pixels.

Each pixel in an image sensor includes several devices including, for example, a photodiode and a plurality of transistors. For effective functioning, devices in an image sensor must be electrically isolated from each other. However, as pixel size becomes smaller, device isolation becomes more difficult, particularly with respect to current leakage between devices. Shallow trench isolation (STI) is a semiconductor processing technique of etching trenches in the wafer substrate to isolate pixels and individual devices within pixels, however, this technique often leads to trap-assisted-tunneling and increased dark current, especially when used in high temperature environments such as those frequently found in automotive applications.

FIGS. 2A and 2B are cross-sectional views of an STI structure during fabrication. Referring to FIG. 2A, substrate 202 is formed from silicon, although other semiconductor materials may be used, for example, bulk substrate silicon substrates doped with n-type or p-type dopants, silicon on insulation (SOI) substrate, silicon germanium or gallium arsenide. Pad oxide layer 204 is grown on the substrate 202, then a masking layer of pad nitride layer 206 is formed on pad oxide layer 204. After a photo-lithography process of patterning pad nitride layer 206, a trench 208 is etched through pad oxide layer 204 and pad nitride layer 206 and into substrate 202 by a process of isotropic dry etching, for example, plasma etching. Trench 208 has a target width, referred to a critical dimension CD and a target depth TD based on requirements of subsequent device fabrication on substrate 202.

FIG. 2B illustrates a completed STI structure after additional process steps including, for example, liner oxidation, oxide-fill, chemical mechanical polishing (CMP) and nitride removal. Trench 208 is filled with an oxide 210 which forms oxide cap 214. A thin oxide layer 212 remains on active portions of substrate 202 in preparation for further processing. The width of oxide cap 214 is slightly smaller the STI boundary as shown by gap G. This is a result of the nitride removal etching process which typically removes a portion of the oxide as well.

Silicon dangling bonds on the walls and bottom of trench 208 resulting from etching can contribute to increased dark current. Dangling bonds or broken bonds formed along the trench sidewall or between a silicon dioxide and silicon interface form trap sites. These trap sites may trap electrons or holes during operation, thus generating current inside or near the photodiode region of individual pixels and contributing to dark current or electrical current generated in photodiode region in absence of incident light. One method used to address this problem is a surface treatment process of thermal annealing and liner oxidation that grows a thin oxide layer on STI structure sidewalls, however this method still leaves enough Si dangling bonds to cause dark current. Another method is boron implantation to passivate the STI-Si-interface, however, boron diffuses into the silicon surrounding the trench and thus impacts the full well capacity of photodiode by reducing photodiode area. Thus, these processes do not completely resolve silicon dangling bonds.

SUMMARY OF THE EMBODIMENTS

In a first aspect, a method of forming a target shallow trench isolation (STI) structure in a semiconductor substrate includes etching a trench having a bottom and sidewalls in the semiconductor substrate, said trench having a depth (D) deeper than a target depth (TD) of the target STI structure and a width (W) wider than a critical dimension (CD) of the target STI structure; and reducing the depth and width of the trench by epitaxially growing a semiconductor material in the trench until the depth reaches the target depth and the width equals the critical dimension.

In a second aspect, a shallow trench isolation (STI) structure having a target depth TD and a critical dimension CD including a semiconductor substrate having a substrate top surface forming a trench extending into the semiconductor substrate and having a trench depth D relative to a planar region of the substrate top surface surrounding the trench such that D is greater than TD and a trench width W at the substrate top surface such that W is greater than CD; and a semiconductor material epitaxially grown in the trench to provide the STI structure having a depth equal to TD and a critical dimension equal to CD.

In a third aspect, an image sensor comprising a semiconductor substrate; a photodiode region comprising one or more photodiodes formed in a planar region of a substrate top surface of the semiconductor substrate; a pixel transistor region comprising one or more pixel transistors formed in the planar region of the substrate top surface; a shallow trench isolation (STI) structure formed between the photodiode region and the pixel transistor region, the STI structure having a target depth TD and a critical dimension CD, the STI structure including a trench extending into the semiconductor substrate and having a trench depth D relative to the planar region of the substrate top surface surrounding the trench such that D is greater than TD and a trench width W at the substrate top surface such that W is greater than CD; and a semiconductor material epitaxially grown in the trench to provide the STI structure having a depth equal to TD and a critical dimension equal to CD.

DETAILED DESCRIPTION OF THE EMBODIMENTS

In embodiments, target shallow trench isolation (STI) structures having a width, typically referred to as a critical dimension (CD) and a target depth (TD) may be formed in a wafer substrate. STI formation in the wafer substrate is performed prior to fabrication of photodiodes, transistors and other devices in the substrate. The CD of STI structures significantly impacts the density of pixels and therefore, the performance of the image sensor. FIGS. 3A-3E depict several stages in the formation of an STI structure according to embodiments. FIGS. 3A-3E are best viewed together in the following description.

Figure 3A:
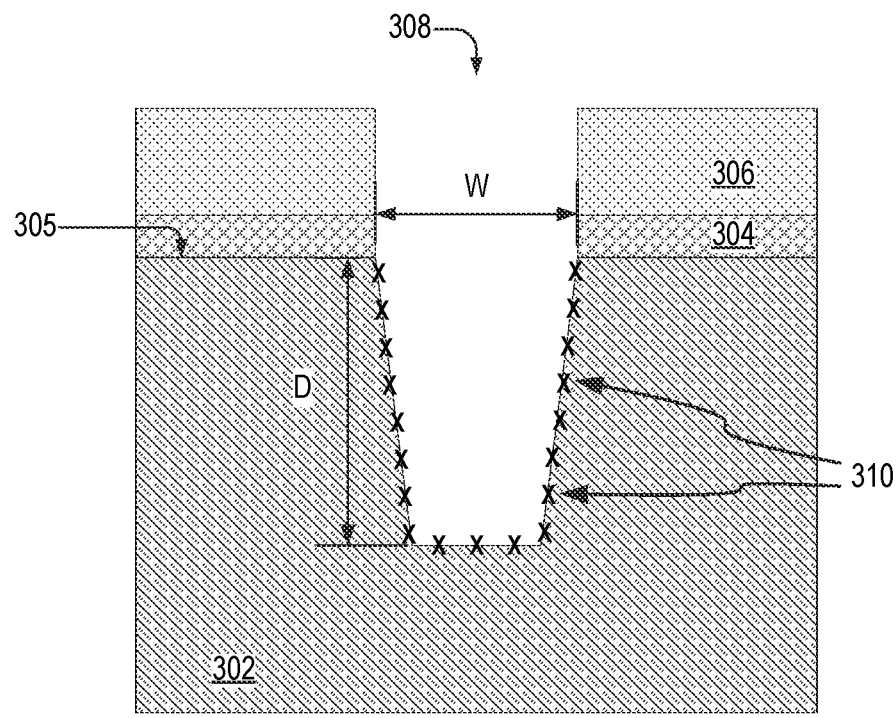
FIG. 3A is a cross-sectional view of a trench etched in a semiconductor substrate, according to an embodiment.

FIG. 3A is cross-sectional view of a substrate 302, a pad oxide layer 304 and a pad nitride layer 306. In an embodiment, substrate 302 is formed from silicon, although other semiconductor materials may be used, for example, bulk substrate silicon substrates doped with n-type or p-type dopants, silicon on insulation (SOI) substrate, silicon germanium, etc. Pad oxide layer 304 may be formed by a process of thermal oxidation to form a thin oxide layer on a planar surface 305 (e.g., front side surface) of substrate 302. In one example, pad nitride layer 306 may be formed on pad oxide layer 304 by depositing silicon nitride material on pad oxide layer 304 using a deposition process such as chemical vapor deposition or physical vapor deposition process, for example. Pad nitride layer 306 is used for a photolithographic process of patterning a surface of substrate 302 in preparation for etching trench 308.

Trench 308 is patterned and etched through pad oxide layer 304 and pad nitride layer 306 and into substrate 302 by a process of isotropic dry etching, for example, plasma etching. In embodiments, isotropic dry etching parameters depend on the material of substrate 302 and include pressure, gas composition (e.g., oxygen $O_2$, fluorine, $SF_6$, $CF_4$, $CHF_3$, $C_4F_8$), gas generation or injection method, and generator power. When removing material from trench 308, the etching process leaves silicon (Si) dangling bonds 310 on the sidewalls and bottom of the trench. For clarity of illustration, not all Si dangling bonds are labeled with a reference numeral in FIG. 3A.

In an embodiment, trench 308 is etched to a depth D deeper into substrate 302 than a target depth (TD) of a target STI structure, and to a width W wider than a critical dimension (CD) of the target STI structure. In an embodiment, depth D and target depth (TD) refers to the depth or distance into the substrate 302 from planar surface 305 of substrate 302, for example, a front side surface of substrate 302 or a substrate top surface of substrate 302. After etching, trench 308 may be subjected to surface treatment processes to remove some Si defects and reduce humidity at the trench surface, for example, Siconi™ and hydrogen bake. Siconi™, for example, is a soft dry chemical etching process (e.g. plasma) that may selectively remove oxidized silicon surface defects by exposing the region to be etched to etching agents such as $H_2$, $HF_3$ and $NH_3$. Hydrogen bake is the subsequent surface clearing process used to remove oxide present on the silicon interface. These processes, however, do not remove all Si dangling bonds created by etching.

Figure 3B:
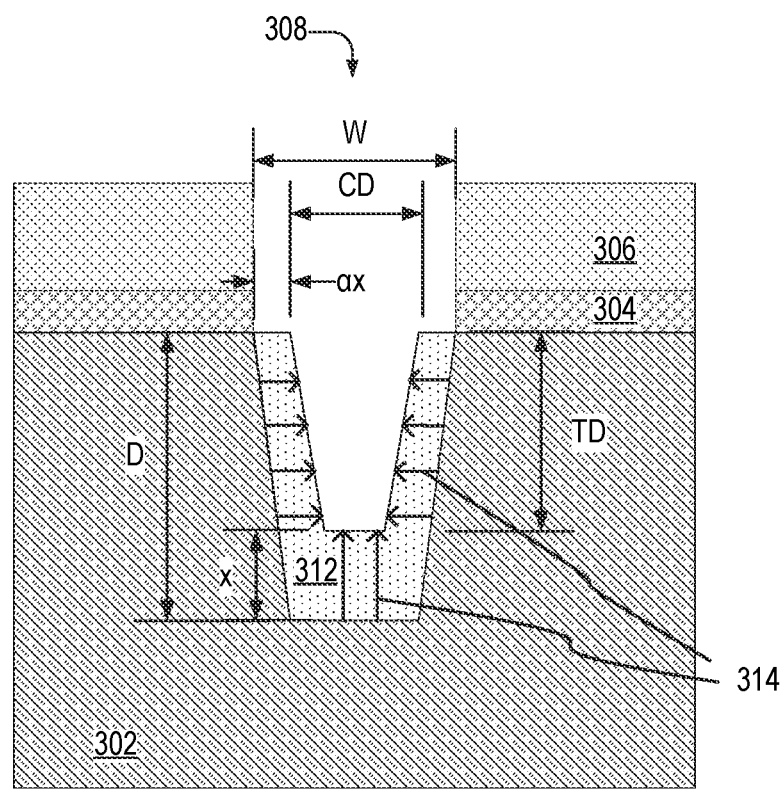
FIG. 3B is a cross-sectional view of the STI of FIG. 3A at a subsequent step in fabrication, in an embodiment.

FIG. 3B is a cross-sectional view of substrate 302 after an epitaxial growth process. Depth D and width W of trench 308 have been reduced by epitaxial growth area 312. Semiconductor material corresponding to the material of substrate 302 is grown on the sidewalls and bottom of trench 308 inside area 312 as shown by arrows 314. Generally, epitaxy is a process of forming new layers on a substrate that have a crystalline structure aligned with that of the substrate as opposed to other techniques that result in a random crystal orientation. In embodiments, a vapor phase epitaxial growth process using, for example, $BH_3$ (borane) and $SiH_4$ (silane), is performed at a temperature of approximately 700 to 750° C. Although a representative example is given, any suitable epitaxial growth process may be used.

Parameters of an epitaxial growth process such as length of time, growth rate and temperature are chosen to grow substrate material on the bottom and sides of trench 308 such that the trench is reduced to the CD and TD of a target STI structure. In an embodiment, the depth of trench 308 is reduced by an amount x that is approximately 50 to 500 angstroms by the epitaxial growth process. Because of the geometry of trench 308, sidewall growth rate is approximately 25-35% of the growth rate of the bottom of the trench. In an embodiment, each sidewall experiences epitaxial growth $$\frac{W - CD}{2} \cong \alpha x$$

where coefficient $\alpha$ is between approximately 0.25 to 0.35. This results in a range for ax of approximately 15 to 150 angstroms on each sidewall.

Figure 3C:
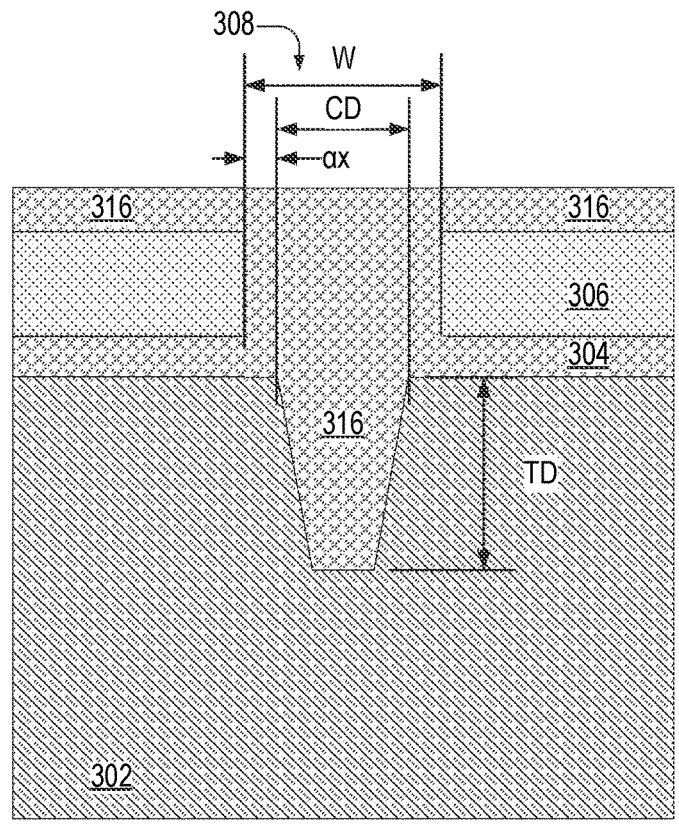
FIG. 3C is a cross-sectional view of the STI of FIG. 3B at a subsequent step in fabrication, in an embodiment.
Figure 3D:
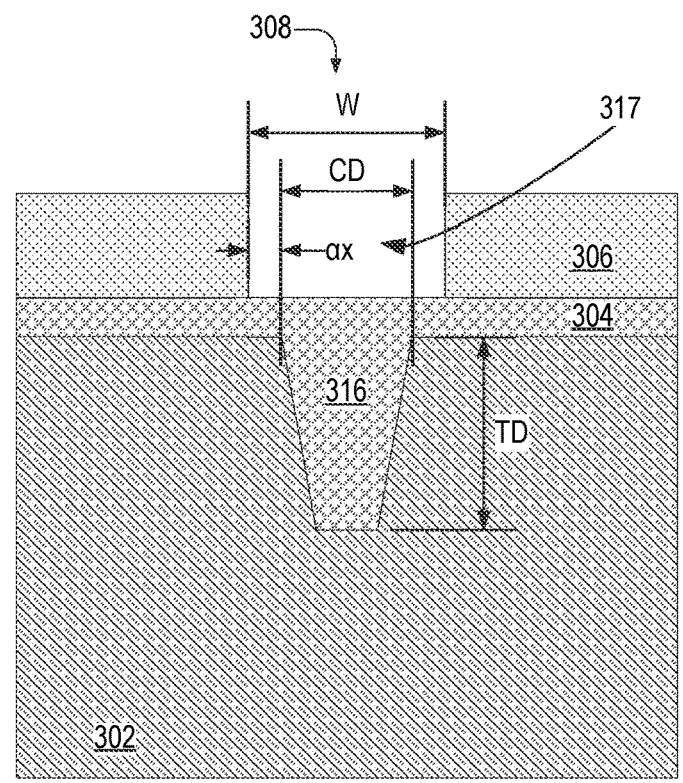
FIG. 3D is a cross-sectional view of the STI of FIG. 3C at a subsequent step in fabrication, in an embodiment.

Because substrate material is epitaxially grown on the surface of trench 308, Si dangling bonds 310 on the sidewall and bottom of trench 308 as shown in FIG. 3A are cured. The incorporation of an epitaxial growth step in STI structure fabrication means that the material grown in trench 308 has a crystalline structure aligned with that of substrate 302. Subsequent STI processing steps are shown in FIGS. 3C and 3D. FIG. 3C is a cross-sectional view of substrate 302 after a step of liner oxidation, where a thin oxide layer is grown in trench 308, and oxide-gap fill, wherein a dielectric material 316 (e.g., silicon oxide) is deposited, filing trench 308 and covering pad nitride layer 306. A chemical mechanical polishing (CMP) process is subsequently performed to planarize dielectric material layer 309 for subsequent processing steps.

FIG. 3D is a cross-sectional view of substrate 302 after a processing step of removing excess dielectric material 316 from the planar surface of pad nitride layer 306. This step also removes a portion of the dielectric material 316 that had filled trench 308 within pad nitride layer 306, indicated at 317. Subsequently, nitride mask or pad nitride layer 306 is removed by an anisotropic etching process e.g., a wet etching process, similar to that used to pattern substrate 302 prior to etching trench 308 as shown in FIG. 3A.

Figure 3E:
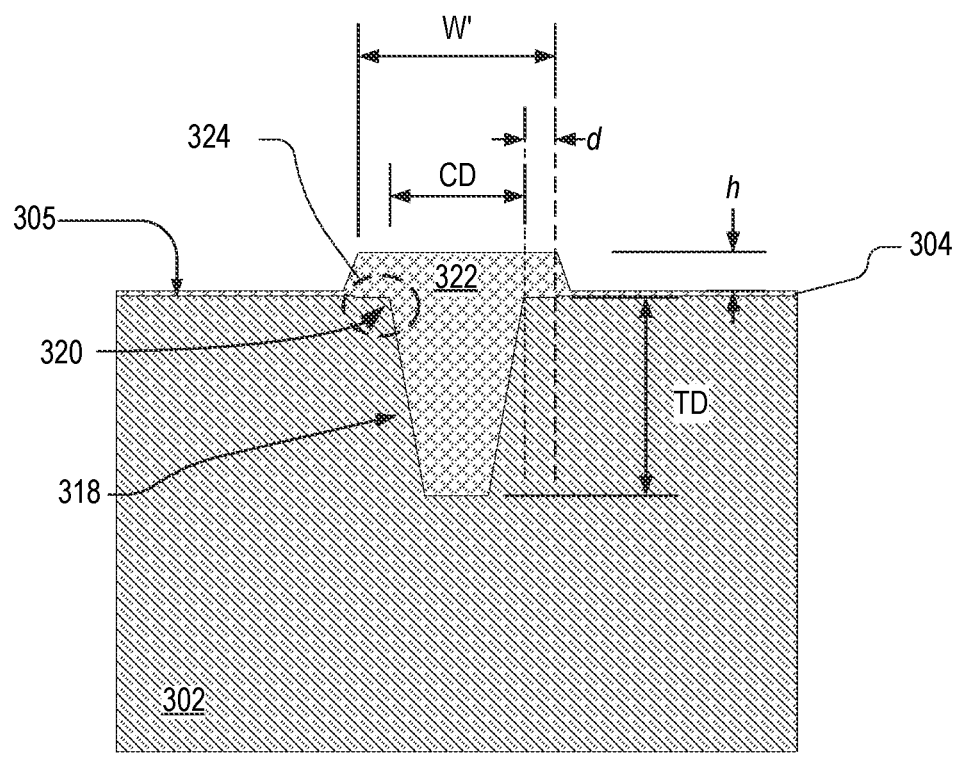
FIG. 3E is a cross-sectional view of an STI structure, according to an embodiment.

FIG. 3E is a cross-sectional view of an embodiment of an STI structure 318 having a CD and a TD of a target STI structure. STI structure 318 includes an oxide cap 322, which protrudes from planar surface 305 of substrate 302 and spans between opposite sides of trench 308 on planar surface 305. The anisotropic etching process described above with reference to FIG. 3D may also remove a portion of pad oxide layer 304 and oxide cap 322. In an embodiment, the height h of oxide cap 322 (e.g., the distance between the planar top surface of oxide cap 322 and a planar top surface of pad oxide layer 304) is related to the initial thickness of pad nitride layer 306 and pad oxide layer 304 as well as the etching process to remove pad nitride layer 306.

Figure 1:
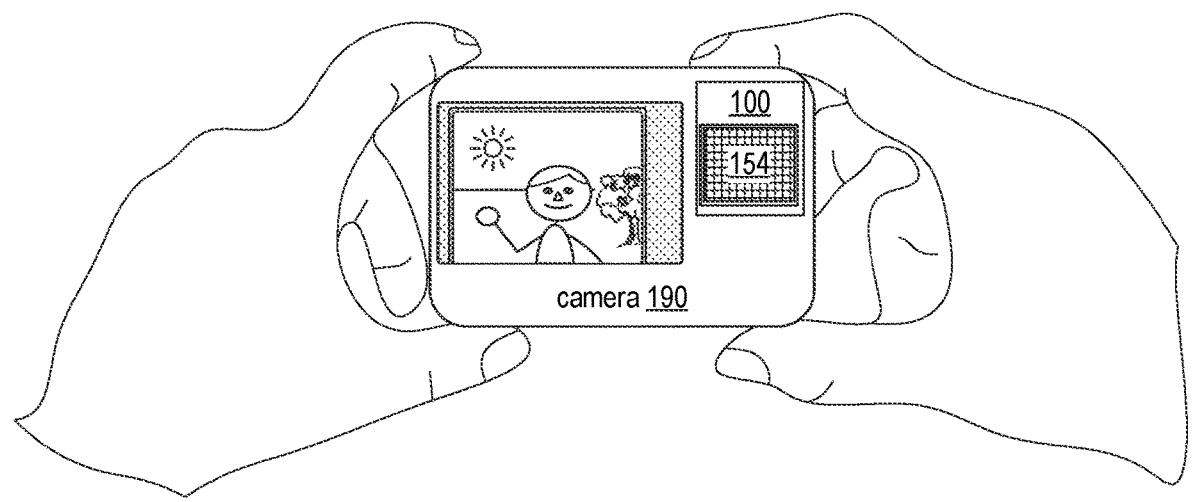
FIG. 1 depicts a camera that includes an image-sensor, in an embodiment.
Figure 2A:
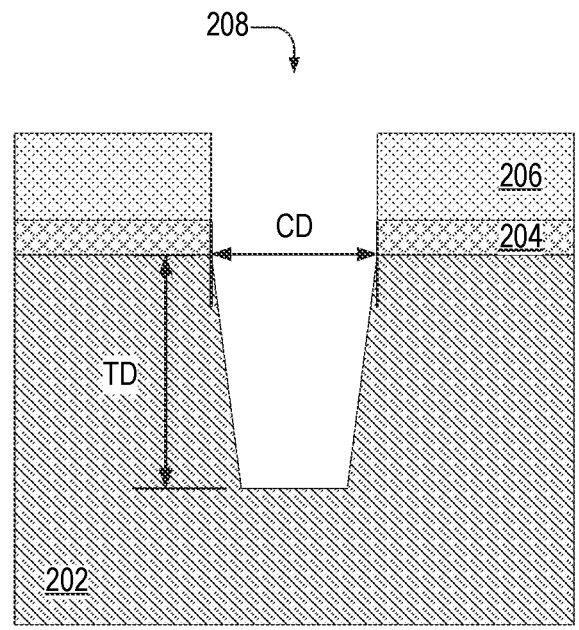
FIGS. 2A and 2B are cross-sectional views of a shallow trench isolation (STI) structure.

In an embodiment, the width W' of oxide cap 322 is related to the width W of trench 308 of FIG. 3A and is greater than the CD of STI structure 318. This width W' of oxide cap 322 is related to a thickness of the sidewall epitaxial growth (e.g., the thickness of epitaxial growth area 312 as shown in FIG. 3B), for example, and provides a better profile to STI structure 318. Because pad nitride layer 306 is etched to have an opening for trench 308 with width W (FIG. 3A), the subsequent deposition of dielectric 316 (FIG. 3C) results in a wider area of dielectric material within pad nitride layer 306, compare, for example, pad nitride layer 206 of FIG. 2A which has an opening for trench 208 that is the same as the CD of the trench 208. In FIG. 3E, oxide cap 322 is wider than the CD of STI structure 318, extending across the boundary (or the interface between substrate and dielectric material 316) of STI structure 318 to at least a lateral distance d to the planar surface 305 (e.g., front side surface or substrate top surface) of substrate 302.

Figure 2B:
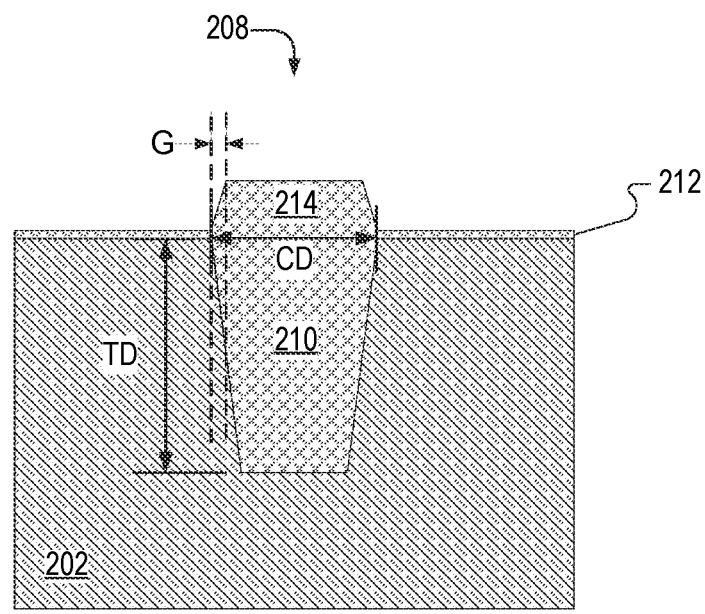

Oxide cap 322 prevents exposure of corner 320 of STI structure 318. Although only one corner is indicated in FIG. 3E, the discussion below applies to both sides of oxide cap 322 in the illustrated cross-sectional view. When corner 320 is exposed, as shown by gap G in FIG. 2B, this may contribute to TDDB (time-dependent dielectric breakdown) failure by gate leakage when a gate electrode is formed in substrate 302. This, in turn, may lower a threshold voltage $V_t$ of a nearby transistor device (e.g., source-follower, reset transistor, row select transistor). Overlap area 324 (indicated by the circled area) of oxide cap 322 and pad oxide layer 304 (functioning as gate oxide of a transistor device) minimizes TDDB failure and improves reliability of a device (e.g., an image sensor device) incorporating STI structure 318.

Figure 4:
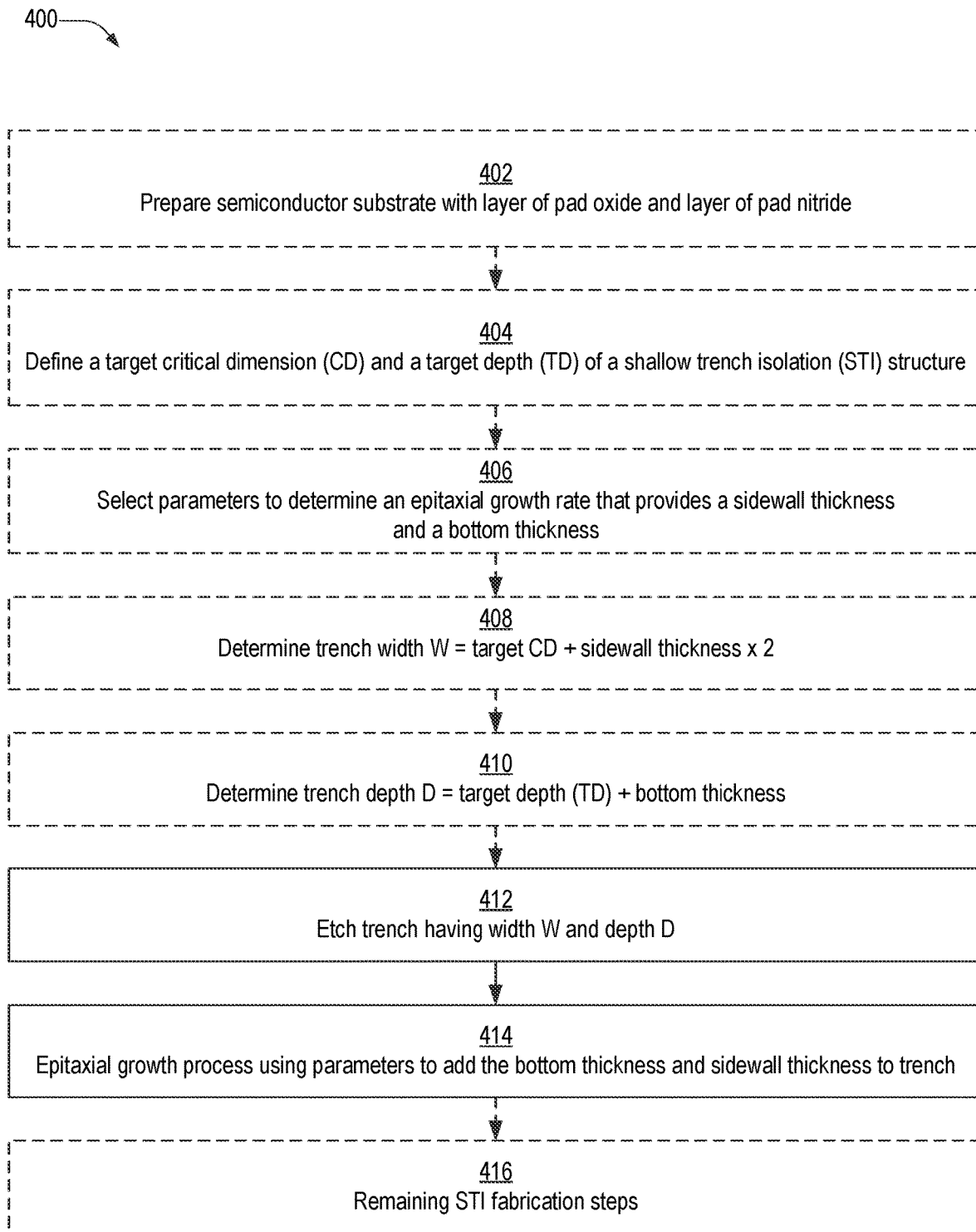
FIG. 4 is a flowchart illustrating a method for fabricating an STI structure, in an embodiment.

FIG. 4 is a flowchart illustrating a method 400 for fabricating an STI structure in an embodiment. Method 400 includes steps 412 and 414. In embodiments, method 400 also includes at least one of steps 402, 404, 406, 408, 410, and 416. In embodiments, method 400 also includes step 414.

Step 402 includes preparing a semiconductor substrate as shown in FIG. 3A with pad oxide and pad nitride layers. In an example of step 402, pad oxide layer 304 and pad nitride layer 306 are formed on substrate 302, although other semiconductor materials may be used. In embodiments, a variety of methods may be used to form pad oxide layer 304 and pad nitride layer 306 as discussed above in reference to FIG. 3A. Pad nitride layer 306 is used for a photolithographic process of patterning a surface of substrate 302 in preparation for etching trench 308.

Step 404 includes defining a critical dimension (CD) and a target depth (TD) of a target STI structure. In an example of step 404, the CD and the TD of the target STI structure are selected based on a preferred density of pixels and a preferred performance of an image sensor formed in the substrate. Step 406 includes selecting parameters for an epitaxial growth process. In an example of step 406, the selected parameters will provide a growth in bottom thickness of x and a growth in sidewall thickness of $$\frac{W - CD}{2} \cong \alpha x$$

where coefficient α is between 0.25 to 0.35. This results in a range for αx of approximately 15 to 150 angstroms on each sidewall.

Step 408 includes determining an etching width for trench 308 of FIGS. 3A-3E. In an example of step 408, a width W is determined that is substantially equal to the CD plus two times the sidewall thickness αx, where α is positive and less than or equal to one. In embodiments, coefficient α is between 0.25 and 0.35. Step 410 includes determining a depth D that is substantially equal to the TD plus a bottom thickness x. In embodiments, steps 406-410 may be performed in any order and/or iteratively.

Step 412 includes patterning and etching trench 308. In embodiments, step 412 includes patterning trench 308 prior to an etching process. In an example of step 412, at least one parameter of an etching process is selected to result in a trench 308 having a width W and a depth D as determined in steps 408 and 410. Step 414 includes performing an epitaxial growth process according to the parameters selected in step 406.

Step 416 may include remaining semiconductor fabrication steps including liner oxidation, dielectric fill-in (e.g., oxide fill), chemical mechanical polishing (CMP) and nitride removal as discussed above and depicted in FIGS. 3C-3D.

In an embodiment, method 400 and STI structure 318 described above provide an additional benefit with regard to forming trenches on a substrate using a pad nitride as a mask. Photolithography processes have a lower effective limit in the size of areas that can be effectively masked. This also limits the critical dimension (e.g., target trench width) that can be achieved for a target STI structure. In embodiments, a target STI structure even smaller than the lower photolithography patterning limitation may be formed by etching a trench at the patterning limitation, then epitaxially growing additional substrate material in the trench. This further reduces the space of STI (spacer between photodiode region and pixel transistor region) and increases an area on the substrate for photodiodes, thus larger size of pixel array can be formed achieving higher imaging resolution.

Method 400 provides a shallow trench isolation structure that is free of Si dangling bonds on the bottom and sidewalls of a trench created by plasma etching because silicon is grown epitaxially on these surfaces, curing the Si dangling bonds. In embodiments, any type of substrate may be used, including doped silicon, as doped silicon may also be epitaxially grown to match the substrate. This provides a doped substrate without silicon-surface damage caused by boron implant doping.

Figure 5A:
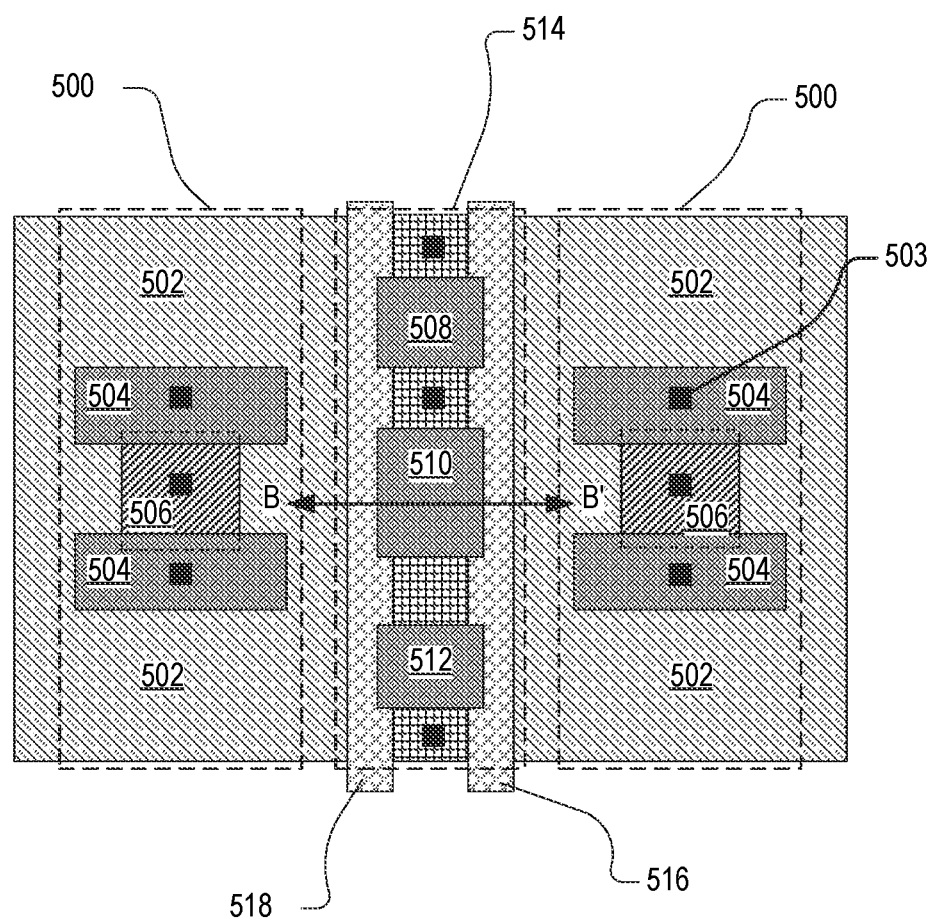
FIG. 5A is a pixel layout for an image sensor incorporating an STI isolation structure in an embodiment.
Figure 5B:
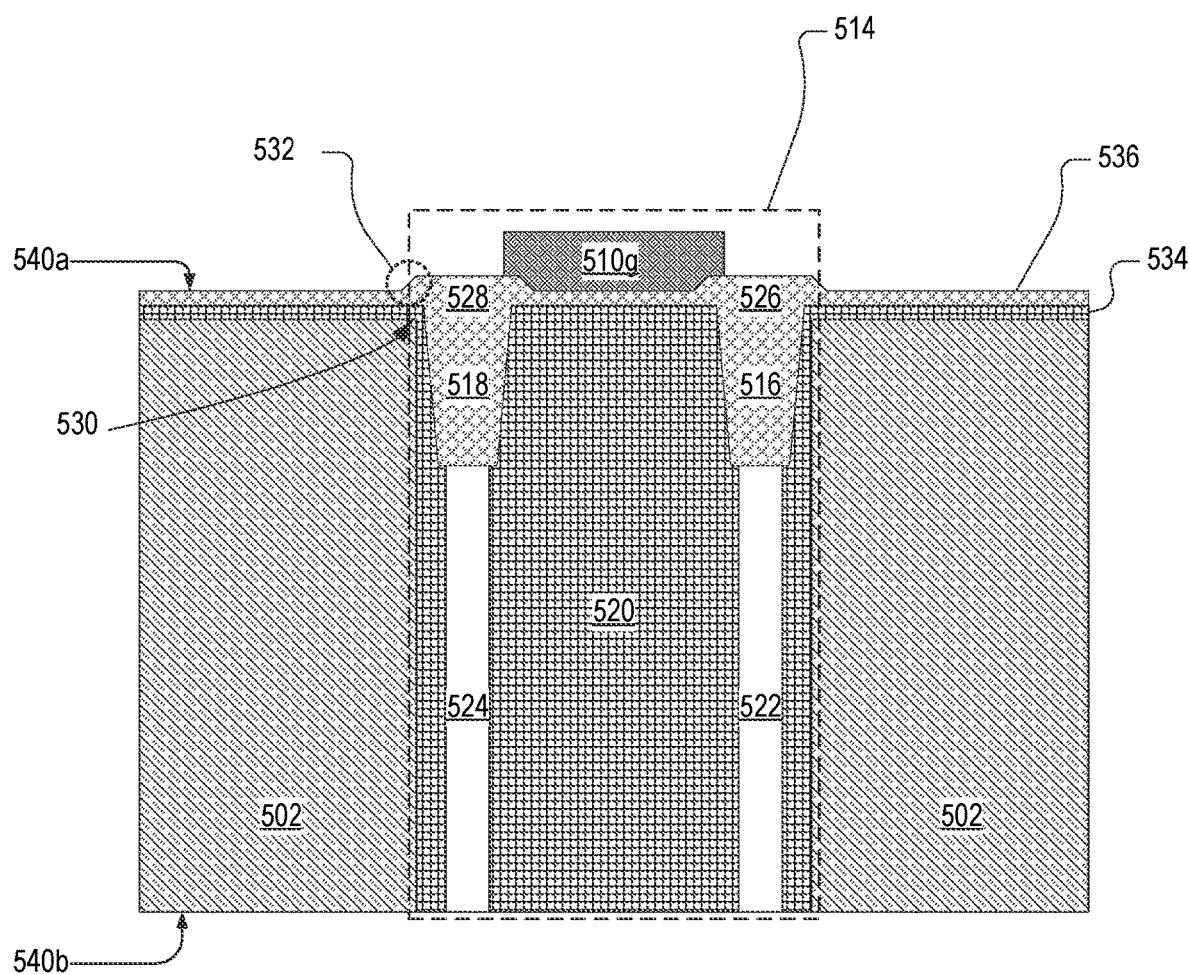
FIG. 5B is a cross-sectional view along a cut line B-B' of FIG. 5A, in an embodiment.

FIG. 5A depicts a partial pixel layout for an image sensor. FIG. 5B depicts a cross-sectional view along a cut line B-B' of FIG. 5A, according to an embodiment. FIGS. 5A and 5B are best viewed together in the following description. FIG. 5A is a plan view showing two adjacent pixels separated by an STI isolation structure according to an embodiment. Each pixel includes a substrate having an active region (or photo-sensing region) 500 and a pixel transistor region 514. Photodiodes 502, transfer transistors 504 and floating diffusion node 506 are formed in the active region of the substrate. Each of transfer transistors 504 selectively transfer photo-generated charges from respective photodiode 502 to the corresponding floating diffusion node 506 in response to a transfer signal received at a transfer gate 503 of the respective transfer transistor 504. Photodiodes 502 and floating diffusion node 506 formed of doped regions having a first conductive type, e.g. N-type which is opposite to the substrate having a second conductive type e.g., P-type. The polarity of the conductive types may be reversed depending on the circuit design. Pixel transistors such as reset transistor 508, source-follower transistor 510 and row select transistor 512 are formed in the pixel transistor region 514 of the substrate adjacent to the active region. Photodiodes 502 in the active region 500 are isolated from pixel transistors in the pixel transistor region 514 by STI structures 516 and 518, corresponding to STI structure 318 of FIG. 3E. In some embodiments, the junction depths of source and drain regions associated with each respective pixel transistor in pixel transistor region 514 is less or shallower than the target depth (TD) of the individual STI structures 516 and 518 with respect to a front-side 540a (FIG. 6) of the substrate.

In one example, reset transistor 508, source-follower transistor 510 and row select transistor 512 are N-channel transistors. In such example, source and drain regions of the respective reset transistor 508, source-follower transistor 510 and row select transistor 512 are N-type doped region i.e. doped regions of the second conductive type opposite to the first conductive type of the substrate.

In the illustrated example, referring to FIG. 5B, photodiodes 502 are separated by pixel transistor region 514, shown in plan view in FIG. 5A. In embodiments, pixel transistor region 514 includes STI structures 516 and 518 formed in a well region of first conductive type, herein referred as P-type well 520 and deep trench isolation structures 522, 524. The use of P-type well 520 to surround STI structures 516 and 518 provides further passivation to the sidewalls of STI structures 516 and 518. Deep trench isolation structures 522 and 524 are located below STI structures 516 and 518, respectively. In one embodiments, deep trench isolation structures 522 and 524 having dielectric material filled in are formed on the backside 540b of the substrate. Deep trench isolation structures 522 and 524 configured to extend from the backside 540b of the substrate into the substrate and land on the bottoms of the respective STI structures 516 and 518. Pinning layer 534 is provided to passivate the silicon oxide/silicon interface between oxide layer 536 and the silicon surface of photodiodes 502 to reduce dark current noise associated with the silicon oxide/silicon interface. Pinning layer 534 is a doped region of first conductive type which is the same as the P-type well 520 and the substrate. In one example, pinning layer 534 is configured to have higher doping concentration than P-type well 520. Pinning layer 534 and P-type well 520 are grounded. In embodiments, STI structures 516 and 518 and deep trench isolation structures 522, 524 collectively isolate the pixel transistors (e.g., reset transistor, source-follower transistor and row select transistor) from the photodiodes 502 disposed in the active region 500.

In some embodiments, deep trench isolation structures 522, 524 may also be disposed between adjacent photodiodes 502 and provide electrical isolation between adjacent photodiodes 502.

Source-follower gate 510g of source-follower transistor 510 is located between oxide caps 526 and 528 of STI structures 516 and 518, respectively in the illustrated cross-section view A-A'. As discussed above with reference to FIG. 3E, overlap area 532 of oxide cap 528 protects corner 530 of STI structure 518 to minimize TDDB failure and improve reliability of the device (e.g., an image sensor device) incorporating STI structure 518. Although only one corner is identified in FIG. 5B, both corners of both oxide cap 528 and oxide cap 526 are similarly protected. A similar benefit also applies to reset transistor 508 and row select transistor 512.

For simplicity, two photodiodes per unit pixel are illustrated in FIG. 5A, but in other embodiments, a pixel may include a larger or smaller number of photodiodes. Similarly, the illustrated pixel layout demonstrates a "four-transistor configuration" that is the pixel transistors for each respective pixel include a transfer transistor, reset transistor, source-follower transistor, and row select transistor. In some embodiments, a pixel may be configured to a "three-transistor configuration" and include only transfer transistor, reset transistor, and source-follower transistor. In some embodiments, a pixel may be configured to a "five transistor configuration" and include transfer transistor, a row select transistor, a source-follower transistor, a reset transistor (and an overflow transistor or a dual floating diffusion (DFD) transistor. Thus, the number of photodiodes in a pixel and the number of pixel transistors used for controlling operation of the pixel may depend on configuration of the respect pixel.

With the use of the STI structure 516 and 518 in the isolation between photodiodes and pixel transistor region of the image sensor, dark current and white pixel noises may be reduced, and improve imaging performance of the image sensor.

Combinations of Features

Features described above as well as those claimed below may be combined in various ways without departing from the scope hereof. The following enumerated examples illustrate some possible, non-limiting combinations:

(A1) A method of forming a target shallow trench isolation (STI) structure in a semiconductor substrate includes etching a trench having a bottom and sidewalls in the semiconductor substrate, said trench having a depth (D) deeper than a target depth (TD) of the target STI structure and a width (W) wider than a critical dimension (CD) of the target STI structure; and reducing the depth and width of the trench by epitaxially growing a semiconductor material in the trench until the depth reaches the target depth and the width equals the critical dimension.

(A2) In method (A1), the semiconductor material may be epitaxially grown at a temperature between approximately 700 and 750° C.

(A3) In method (A1), the epitaxially grown semiconductor material may be the same as the semiconductor substrate.

(A4) In any of methods (A1)-(A3), the semiconductor substrate and the epitaxially grown semiconductor material may be formed of silicon.

(A5) In method (A4), the epitaxially grown semiconductor material is doped silicon.

(A6) Any of methods (A1)-(A5) may further include oxidizing the semiconductor substrate to form an oxide layer on a surface of the semiconductor substrate.

(A7) Method (A6) may further include filling the trench with an oxide.

(A8) Method (A7) may further include forming an oxide cap having a width greater than CD and a height h above a substrate top surface.

(A9) In any of methods (A1)-(A8) D−TD may be between approximately 50 and 500 angstroms.

(A10) In any of methods (A1)-(A9), (W−CD)/2 may be between approximately 15 and 150 angstroms.

(A11) In any of methods (A1)-(A10), when the substrate may have a top surface, the method may further include forming the target STI structure in the top surface and forming a photodiode and at least one pixel transistor in the top surface on opposite sides of the target STI structure.

(B1) A shallow trench isolation (STI) structure having a target depth TD and a critical dimension CD includes a semiconductor substrate having a substrate top surface forming a trench extending into the semiconductor substrate and having a trench depth D relative to a planar region of the substrate top surface surrounding the trench such that D is greater than TD and a trench width W at the substrate top surface such that W is greater than CD; and a semiconductor material epitaxially grown in the trench to provide the STI structure having a target depth equal to TD and a critical dimension equal to CD.

(B2) In structure (B1), the epitaxially grown semiconductor material is the same as the semiconductor substrate.

(B3) In structures (B2), the semiconductor substrate and the epitaxially grown semiconductor material may be formed of silicon.

(B4) In structure (B3), the epitaxially grown semiconductor material is doped silicon.

(B5) Any of structures (B1)-(B4) may further include an oxide filling said trench.

(B6) Any of structures (B1)-(B5) may further include an oxide cap having a width greater than CD and a height h above a substrate top surface.

(B7) In any of structures (B1)-(B6), D−TD may be between approximately 50 and 500 angstroms.

(B8) In any of structures (B1)-(B7), (W−CD)/2 may be between approximately 15 and 150 angstroms.

(B9) In any of the structures (B1)-(B8), the STI structure may be disposed on a wafer between at least one photodiode and at least one pixel transistor formed on the wafer.

(C1) An image sensor includes a semiconductor substrate; a photodiode region have one or more photodiodes formed in a planar region of a substrate top surface of the semiconductor substrate; a pixel transistor region including one or more pixel transistors formed in the planar region of the substrate top surface; and an STI structure according to any of embodiments (B1)-(B9) formed between the photodiode region and the pixel transistor region according to any of the method embodiments of (A1)-(A11).

Changes may be made in the above methods and systems without departing from the scope hereof. It should thus be noted that the matter contained in the above description or shown in the accompanying drawings should be interpreted as illustrative and not in a limiting sense. Herein, and unless otherwise indicated: (a) the adjective "exemplary" means serving as an example, instance, or illustration, and (b) the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A method of forming a target shallow trench isolation (STI) structure in a semiconductor substrate, comprising:
    etching a trench having a bottom and sidewalls in the semiconductor substrate, said trench having a depth (D) deeper than a target depth (TD) of the target STI structure and a width (W) wider than a critical dimension (CD) of the target STI structure;
    reducing the depth and width of the trench by epitaxially growing a layer of semiconductor material in the trench until the depth equals the target depth and the width equals the critical dimension, wherein the semiconductor substrate and the layer of semiconductor material are formed of the same material;
    depositing a dielectric material on the layer of semiconductor material in the trench and on the semiconductor substrate;
    removing a portion of the dielectric material to form an oxide cap having a width greater than the CD and a height h above a substrate surface of the semiconductor substrate; and
    forming a gate electrode of a transistor on at least a part of the oxide cap and the semiconductor substrate.

2. The method of claim 1, wherein the semiconductor material is epitaxially grown at a temperature between approximately 700 and 750° C.

3. The method of claim 1, wherein the semiconductor substrate and the epitaxially grown layer further comprise doped silicon.

4. The method of claim 1, further comprising growing an oxide layer on the epitaxially grown layer prior to depositing the dielectric material in the trench.

5. The method of claim 1, wherein the step of etching a trench further comprises patterning the semiconductor substrate using masking layers prior to etching.

6. The method of claim 1, further comprising:
    forming the target STI structure in a top surface of the semiconductor substrate; and
    forming a photodiode in the semiconductor substrate and at a pixel transistor in the top surface on opposite sides of the target STI structure.

7. The method of claim 1, wherein the semiconductor substrate and the layer of semiconductor material comprise silicon, and the dielectric material comprises an oxide.

8. The method of claim 1, wherein the step of forming the gate electrode comprises forming the gate electrode on a portion of an overlap area between the oxide cap and the substrate surface of the semiconductor substrate.

9. The method of claim 1, further comprising forming a well region having the same conductive type as the semiconductor substrate surrounding the STI structure.

10. The method of claim 9, wherein the well region extends to a depth deeper into the semiconductor substrate than the target depth.

11. The method of claim 1, wherein the step of forming the gate electrode comprises forming the gate electrode on a portion of a first overlap area between the oxide cap of the STI structure and the top surface of the semiconductor substrate and a portion of a second overlap area between the oxide cap of the first second structure and a top surface of the semiconductor substrate.

12. A method of forming a target shallow trench isolation (STI) structure in an image sensor comprising a pixel transistor region disposed in a planar region of a top surface of a semiconductor substrate between two adjacent photodiode regions, the method comprising:
- forming a first STI structure and a second STI structure parallel to the first STI structure such that i) the pixel transistor region is disposed between the first and second STI structures and ii) the first STI structure and the second STI structure are between the two adjacent photodiode regions, wherein the step of forming each of the first STI structure and the second STI structure comprises:
    - etching a trench having a bottom and sidewalls in the semiconductor substrate, said trench having a depth (D) deeper than a target depth (TD) of the target STI structure and a width (W) wider than a critical dimension (CD) of the target STI structure; and
    - epitaxially growing a layer of semiconductor material in the trench until the depth equals the target depth and the width equals the critical dimension, wherein the semiconductor substrate and the layer of semiconductor material comprises the same material;
    - depositing a dielectric material on the layer of semiconductor material in the trench and on the semiconductor substrate;
    - removing a portion of the dielectric material to form an oxide cap having a width greater than CD and a height h above a substrate surface of the semiconductor substrate; and
- forming a gate electrode of a pixel transistor on the semiconductor substrate in the pixel transistor region and on the oxide cap of the first STI structure and the oxide cap of the second STI structure.

13. The method of claim 12, wherein the semiconductor substrate and the layer of semiconductor material comprise silicon, and the dielectric material comprises an oxide-based material.

14. The method of claim 12, wherein the pixel transistor further comprises a source electrode and a drain electrode, the gate electrode coupling the source electrode and the drain electrode, and wherein the gate electrode overlaps with both the oxide cap of the first STI structure and the oxide cap of the second STI structure.

15. The method of claim 12, wherein forming the first STI structure and the second STI structure further comprises etching the trench along a channel direction of the pixel transistor.

16. The method of claim 15, further comprising wherein the step of etching the trench along a channel direction of the pixel transistor further comprises etching the trench along the channel direction such that the trench extends across at least two photodiode regions arranged in a row or a column direction.

17. The method of claim 12, further comprising forming the first STI structure and the second STI structures in a well region having the same conductive type as the layer of semiconductor material.

* * * * *